United States Patent
Wang

[11] Patent Number: 6,066,550
[45] Date of Patent: May 23, 2000

[54] METHOD OF IMPROVING SELECTIVITY BETWEEN SILICON NITRIDE AND SILICON OXIDE

[75] Inventor: Kuang-Chih Wang, Houli Hsiang Taichung Hsien, Taiwan

[73] Assignee: United Integrated Circuits Corp., Hsinchu, Taiwan

[21] Appl. No.: 09/173,486

[22] Filed: Oct. 14, 1998

[30] Foreign Application Priority Data

Jun. 5, 1998 [TW] Taiwan ................................ 87108922

[51] Int. Cl.⁷ .................... H01L 21/3205; H01L 21/4763
[52] U.S. Cl. ............................ 438/586; 438/623; 438/778
[58] Field of Search .................................. 438/156, 242, 438/489, 778, 586, 623

[56] References Cited

U.S. PATENT DOCUMENTS

| | | |
|---|---|---|
| 4,287,526 | 9/1981 | Sakuma ..................................... 357/23 |
| 5,021,355 | 6/1991 | Dhong et al. . |
| 5,075,130 | 12/1991 | Reeber et al. . |
| 5,151,378 | 9/1992 | Ramde ...................................... 437/41 |
| 5,233,215 | 8/1993 | Baliga ...................................... 257/490 |
| 5,641,694 | 6/1997 | Kenney .................................... 438/156 |
| 5,959,330 | 9/1999 | Tokuyama et al. ...................... 257/345 |

*Primary Examiner*—Richard Elms
*Assistant Examiner*—Michael S. Lebentritt
*Attorney, Agent, or Firm*—Jiawei Huang; J.C. Patents

[57] ABSTRACT

A method of improving selectivity between silicon nitride and silicon oxide. A pad oxide is formed on a substrate. Using low pressure chemical vapor deposition or plasma enhanced chemical vapor deposition, a silicon nitride layer is formed on the silicon oxide layer. The silicon nitride is implanted by boron ions to transform into boron nitride. A conventional method is performed to form a shallow trench isolation.

17 Claims, 4 Drawing Sheets

METHOD OF IMPROVING SELECTIVITY BETWEEN SILICON NITRIDE AND SILICON OXIDE

CROSS-REFERENCE TO RELATED APPLICATION

This application claims the priority benefit of Taiwan application Ser. No. 87108922, filed Jun. 5, 1998, the full disclosure of which is incorporated herein by reference.

BACKGROUND OF THE INVENTION

1. Field of the Invention

The invention relates in general to a method of detecting the polishing stop or etching stop while performing a chemical mechanical polishing (CMP) process, and more particularly, to a method of improving the selectivity between silicon nitride and silicon oxide.

2. Description of the Related Art

In the fabrication process of an integrated circuit, surface planarization is an important technique to achieve high precision of photolithography. Only the planarized surface can avoid scattering of an incident light, and thus to obtain a pattern transferred precisely. As the fabricating technique of semiconductor is developed towards to a line width of sub-micron, chemical mechanical polishing is the only technique that can achieve a global planarization for ultra-large scaled integrated circuits (ULSI) or very large scaled integrated circuits (VLSI) so far. The chemical mechanical polishing is also one of the very few techniques that can achieve planarization of deposition layers while fabricating multi-level interconnection.

To control the parameters of chemical mechanical polishing is very complex. In practical application, this technique is further restricted by process assembling, for example, the technique is lack of an effective end-point detection system and controllability of contamination. In the current technique, a stop layer is typically used for end-point detection. The development of chemical mechanical is therefore focused on how to improve the planarity of the polished layer, the speed of polishing, the polishing selectivity, and the end-point detection. The polishing selectivity is the ratio of polishing speed between different materials.

In a conventional method of forming a shallow trench isolation, the selectivity between silicon nitride and silicon oxide is low. The process is shown in FIG. 1A to FIG. 1E.

In FIG. 1A, a paad oxide layer 21 having a thickness of about 250 Å is formed on a silicon substrate 20 in a diffusion furnace.

In FIG. 1B, using low pressure chemical vapor deposition (LPCVD), a silicon nitride layer 22 with a thickness of about 1500 Å is formed on the pad oxide layer 21. Using reactive ion etch (RIE), a part of the silicon nitride layer 22 and the pad oxide layer 21 are removed to form a trench 23 as shown in FIG. 1C.

In FIG. 1D, a tetra-ethy-ortho-silicate (TEOS) oxide layer 24 having a thickness of about 8000 Å is deposited on the silicon nitride layer 22 and to fill the trench 23. In FIG. 1E, the TEOS oxide layer 24 is then polished with the silicon nitride layer 22 as a polishing stop.

In the method of fabricating a shallow trench isolation mentioned above, the selectivity between the TEOS oxide layer 24 and the silicon nitride 22 is as low as 3 to 5. The silicon nitride layer 22 is therefore not a very effective polishing stop.

Various methods to improve the selectivity between silicon oxide and silicon nitride have been developed, such as using new slurry for chemical mechanical polishing, adapting multi-step process of polishing with different polishing pad for each step, or using an end point detection to determine whether the polishing is completed or not. None of the above method has effectively obtained a polishing result. The reason is that the selectivity between silicon nitride and silicon oxide is too low to be an end point of polishing. As shown in FIG. 1F, for the selectivity between silicon oxide and silicon nitride is low, a part of the silicon nitride layer 22 is removed while removing polishing the TEOS oxide layer 24. The tolerance window of over-etching becomes very narrow, that is, the silicon nitride layer 22 can not function as a proper stop layer. The silicon nitride layer 22 is very likely to be removed. Even the pad oxide layer 21, or even the substrate is possible to be removed.

SUMMARY OF THE INVENTION

It is an object of the invention to provide a method of improving the selectivity between silicon nitride and silicon oxide. By increasing the selectivity between the polished layer and the stop layer, the tolerance window for over-etching is improved. Furthermore, the uniformity of polishing is also improved.

To achieve the above-mentioned object and advantages, a method of increasing the selectivity between silicon nitride and the silicon oxide is provided. A pad oxide layer is formed on a substrate. Using chemical vapor deposition (CVD), a silicon nitride layer is formed on the pad oxide layer. The silicon nitride layer is implanted with boron to transform into a boron nitride layer. Using the conventional technique to form a shallow trench isolation. After filling the trench with a dielectric layer, a planarization step such as chemical mechanical polishing or etching back is performed. For using chemical mechanical polishing, the boron nitride layer is used as the stop layer. Whereas for using etching back for planarization, the selectivity between silicon nitride and silicon oxide.

Both the foregoing general description and the following detailed description are exemplary and explanatory only and are not restrictive of the invention, as claimed.

DESCRIPTION OF THE PREFERRED EMBODIMENTS

Figure 1A:
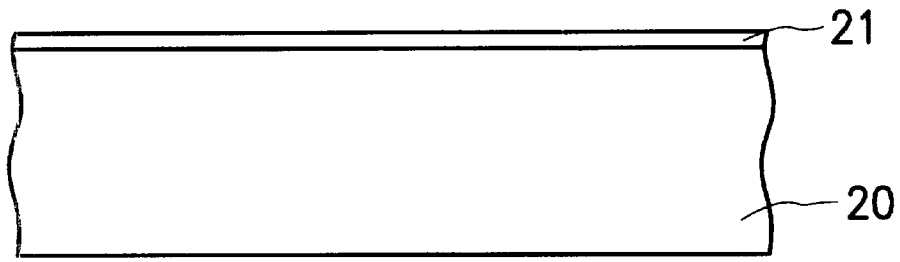
FIG. 1A to FIG. 1E are cross sectional views showing a conventional method for forming a shallow trench isolation.
Figure 1B:
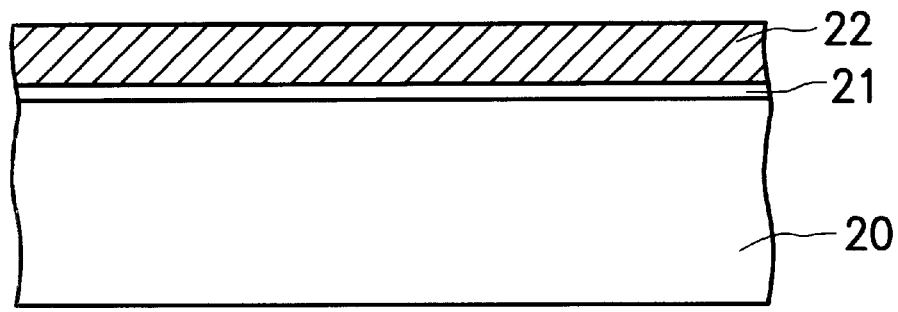
Figure 1C:
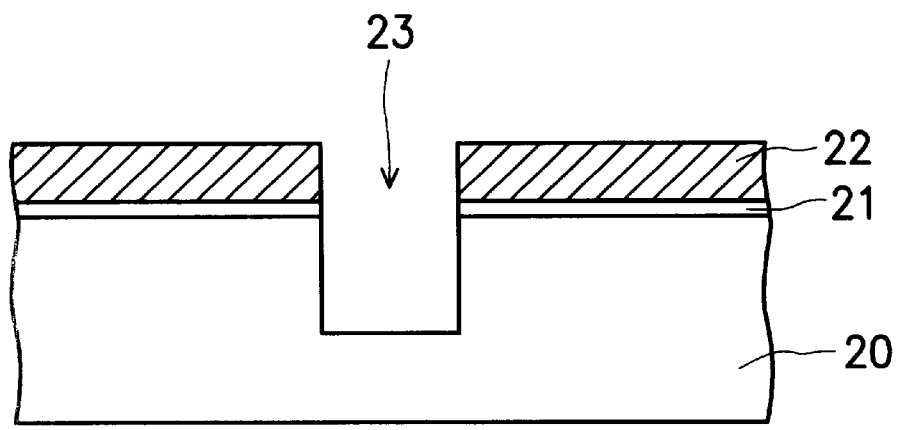
Figure 1D:
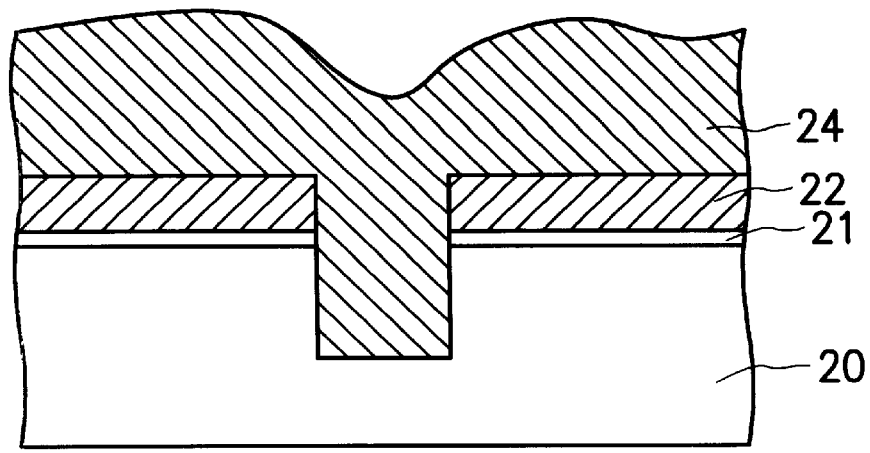
Figure 1E:
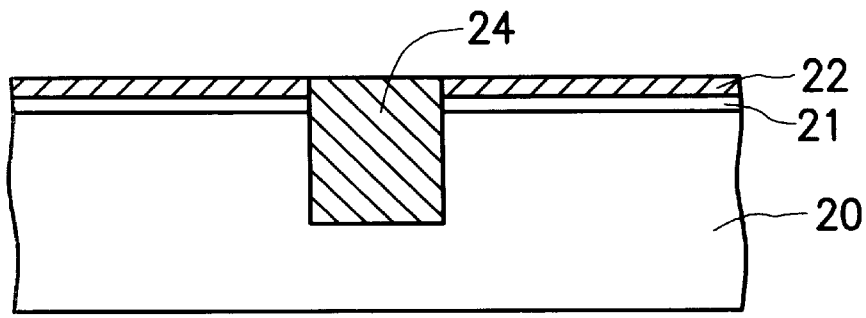
Figure 1F:
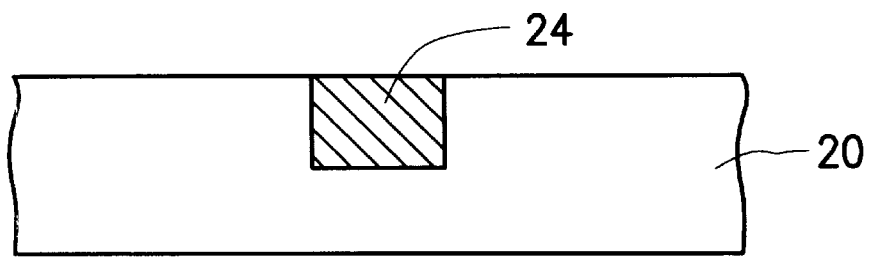
FIG. 1F shows a structure for being over-etched.
Figure 2A:
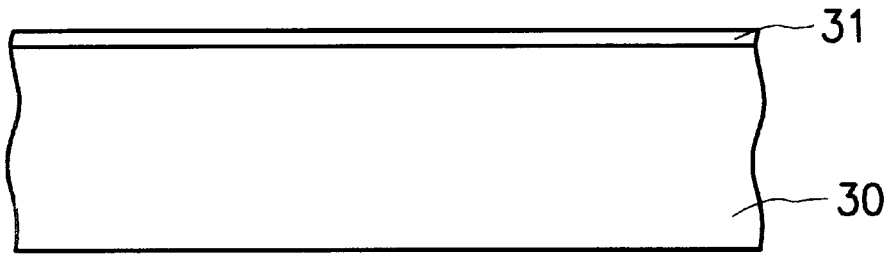
FIG. 2A to FIG. 2F are cross sectional views showing method for forming a shallow trench isolation in a preferred embodiment according to the invention.

In FIG. 2A, a pad oxide layer 31 having a thickness of about 250 Å is formed on a substrate 30, for example, a silicon substrate or a semiconductor substrate. The pad oxide layer 31 is preferably formed in a diffusion furnace.

Figure 2B:
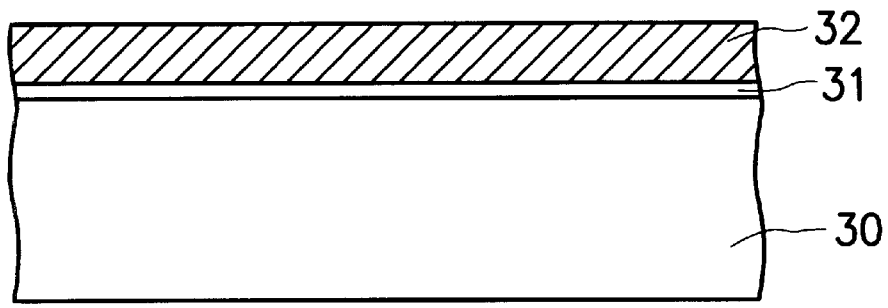

In FIG. 2B, a silicon nitride layer 32 having a thickness of about 2000 Å is formed on the pad oxide layer 30. The silicon nitride layer 32 is formed by chemical vapor deposition, preferably, by low pressure chemical vapor deposition or plasma enhanced chemical vapor deposition (PECVD).

Figure 2C:
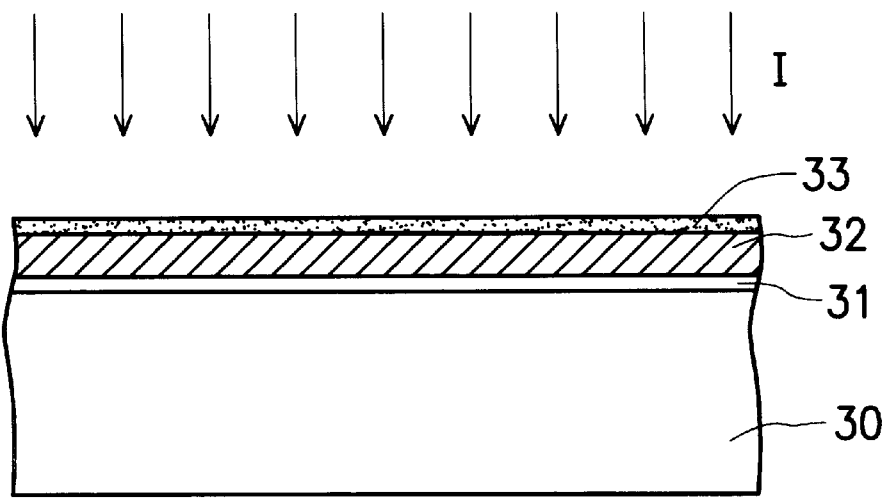

In FIG. 2C, an ion implantation process is performed. Ions are implanted into the silicon nitride layer 32, so that a portion of the silicon nitride layer 32 is transformed into a boron nitride layer 33. The portion of the silicon nitride layer 32 to be transformed depends on the specific requirement, that is, the thickness of the boron nitride layer 33 can be adjusted as required according to the specific requirement. The thickness of the boron silicon layer 33 is about 500 Å in this example.

Figure 2D:
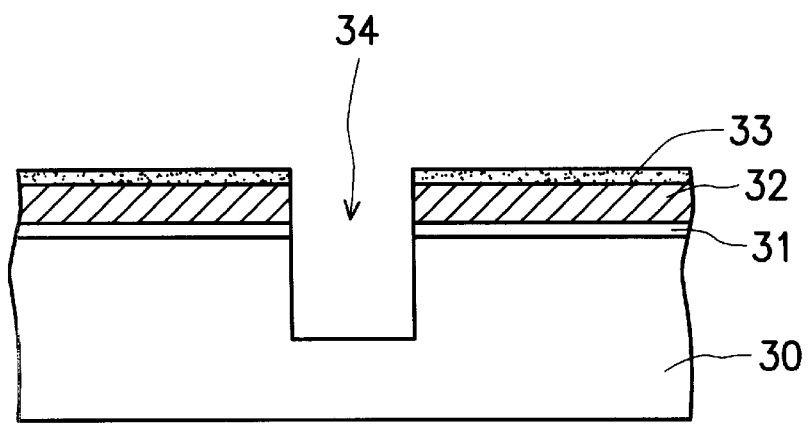

In FIG. 2D, a part of the boron nitride layer 33, the oxide layer 32, the pad oxide layer 31, and the substrate 30 are removed to form a trench 34 within the substrate 30.

Figure 2E:
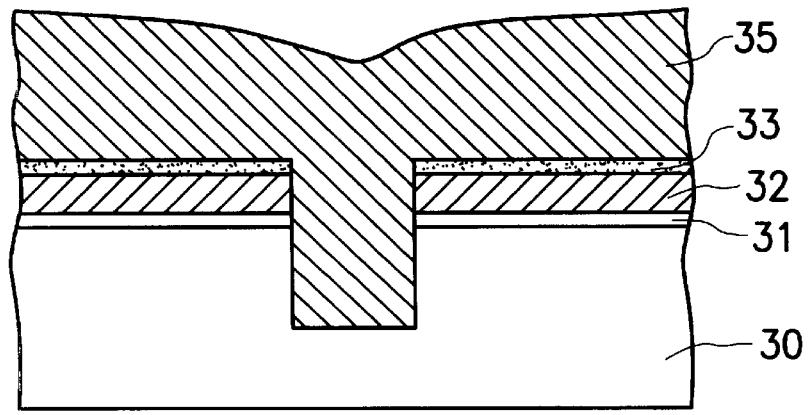

In FIG. 2E, an oxide layer 35 is formed on the structure shown in FIG. 2D. The method of forming oxide layer 35 is a conventional technique and is not described in detail here.

Figure 2F:
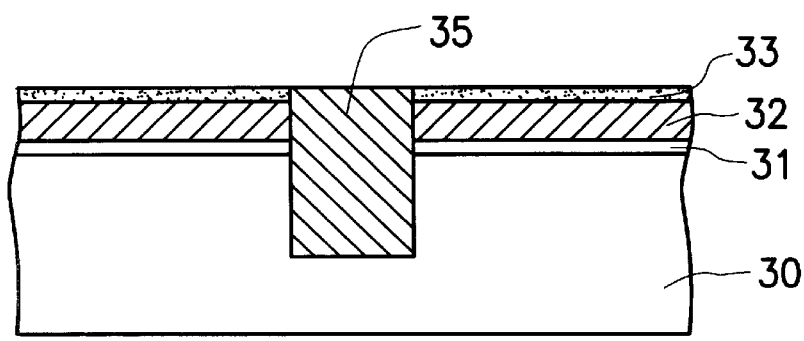

In FIG. 2F, the oxide layer 35 on the boron nitride layer 33 is removed by chemical mechanical polishing. A shallow trench isolation is then formed.

One of the characteristics of the invention is the process of transforming the silicon nitride layer into a boron nitride layer. The polishing or etching selectivity between silicon nitride and silicon oxide is much smaller than the selectivity between boron nitride and the silicon oxide. Therefore, the boron nitride can be functioned as an effective polishing stop or etch stop.

The other characteristic of the invention is that the over-etch tolerance window is enlarged. That is, the possibility to damage the underlying deposition layer or device is minimized. In addition, since the over-etch tolerance window is enlarged, a better uniformity is obtained.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of improving a selectivity between silicon nitride and silicon oxide, comprising:

forming a pad oxide layer on a substrate;

forming a silicon nitride layer on the pad oxide layer;

implanting boron ions into the silicon nitride layer to transform at least a portion of the silicon nitride layer as a boron nitride layer; and forming an oxide layer on the boron nitride layer; and polishing the oxide layer with the boron nitride layer as a polishing stop.

2. The method according to claim 1, wherein the silicon nitride layer has a thickness of about 2000 Å.

3. The method according to claim 1, wherein the silicon nitride layer is formed by plasma enhanced chemical vapor deposition.

4. The method according to claim 1, wherein the silicon nitride layer is formed by low pressure chemical vapor deposition.

5. The method according to claim 1, wherein the boron nitride layer has a thickness of about 500 Å.

6. The method according to claim 1, wherein the silicon oxide layer includes a tetra-ethyl-ortho-silicate oxide layer.

7. A method of improving the selectivity between silicon nitride and silicon oxide, comprising:

forming a silicon nitride layer on a substrate;

implanting the silicon nitride layer with boron ions;

forming a silicon oxide layer; and etching back the silicon oxide layer with the silicon nitride layer as an etch stop.

8. The method according to claim 7, wherein the silicon nitride layer has a thickness of about 2000 Å.

9. The method according to claim 7, wherein after the implanting step, at least a part of the silicon nitride layer is transformed into a boron nitride layer.

10. The method according to claim 9, wherein the boron nitride layer has a thickness of about 500 Å.

11. The method according to claim 7, wherein the etching back process includes a chemical mechanical polishing process.

12. A method of forming a shallow trench isolation in a substrate, comprising:

forming a silicon nitride layer on the pad oxide;

implanting the silicon nitride layer with boron ions;

removing a part of the silicon nitride layer, the pad oxide layer, and the substrate to form a trench within the substrate;

forming a silicon oxide layer on the silicon nitride layer and to fill the trench; and planarizing the silicon oxide layer with the silicon nitride layer as a stop layer.

13. The method according to claim 12, further comprising the step for forming a pad oxide layer on the substrate before forming the silicon nitride layer.

14. The method according to claim 12, wherein the silicon nitride layer has a thickness of about 2000 Å.

15. The method according to claim 12, wherein at least a portion of the silicon nitride layer is transformed into a boron nitride layer after being implanted with boron ions.

16. The method according to claim 15, wherein the boron nitride layer has a thickness of about 500 Å.

17. The method according to claim 12, wherein the silicon oxide layer is planarized by chemical mechanical polishing.

* * * * *